United States Patent [19]

Reinschmidt

[11] Patent Number: 4,617,475

[45] Date of Patent: Oct. 14, 1986

[54] WIRED LOGIC VOTING CIRCUIT

[75] Inventor: Robert M. Reinschmidt, San Jose, Calif.

[73] Assignee: Trilogy Computer Development Partners, Ltd., Cupertino, Calif.

[21] Appl. No.: 595,086

[22] Filed: Mar. 30, 1984

[51] Int. Cl.$^4$ .................. H03K 19/23; H03K 19/086; G06F 11/16; G06F 11/26

[52] U.S. Cl. .................................. 307/441; 307/464; 307/202.1; 307/455; 371/25; 371/36

[58] Field of Search ...................... 307/441, 442, 202.1, 307/455, 464, 219; 371/25, 36

[56] References Cited

U.S. PATENT DOCUMENTS

| | | | |
|---|---|---|---|
| 3,134,032 | 5/1964 | Mann | 307/441 X |
| 3,678,292 | 7/1972 | Hampel | 307/464 |
| 3,838,393 | 9/1974 | Dao | 307/464 X |
| 3,916,215 | 10/1975 | Gaskill, Jr. et al. | 307/464 X |
| 4,250,570 | 2/1981 | Tsang et al. | 307/441 X |

FOREIGN PATENT DOCUMENTS 2024278 3/1971 Fed. Rep. of Germany ...... 307/464

OTHER PUBLICATIONS

Gardner et al, "Majority Logic Circuit", *IBM-TDB*, vol. 9, No. 11, pp. 1664–1665, 4/1967.
Ho et al, "Adaptive Majority Logic", *IBM-TDB*, vol. 13, No. 10, pp. 2830–2831, 3/1971.
Hampel et al, "Threshold Logic", *IEEE Spectrum*, pp. 32–39; 5/1971.

*Primary Examiner*—Larry N. Anagnos

*Attorney, Agent, or Firm*—Townsend and Townsend

[57] ABSTRACT

A wired voting circuit is described providing an output which follows the majority of input logic levels according to the equation: $F = AB + AC + BC$. A non-inverting signal voting node (D) and an inverting signal voting node (E) comprise a first and a second collector of an odd number of input differential transistor pairs (30, 32, 34) wherein said nodes are formed by wiring all of said first collectors together at one signal node and by wiring all of said second collectors together at the other signal node. Each signal node is coupled to a differential input of an output differential transistor pair (36). Currents are steered by the state of input logic onto either of the signal nodes, depending upon the input logic signal level. The signal level at each voting node is proportional to the number of input differential transistor pairs that steer current to the voting node. The voting scheme employs an odd number of logic inputs (T, U, V), such that an odd number of currents ($I_x$, $I_y$, $I_z$) are steered to the voting nodes. Therefore, the signal level at a first voting node is never equal to that of the other voting node during a steady state condition; the signal level difference between the two voting nodes is indicative of the majority state of the input logic signals. An output differential transistor pair compares the signal level difference and translates it to voltage levels compatible with other signals in the system in which the invention is used. By providing redundant signal pathways, signal processing reliability is enhanced. Monolithic device yields are improved by providing for diagnosis of faulty signal pathways and elimination thereof.

4 Claims, 6 Drawing Figures

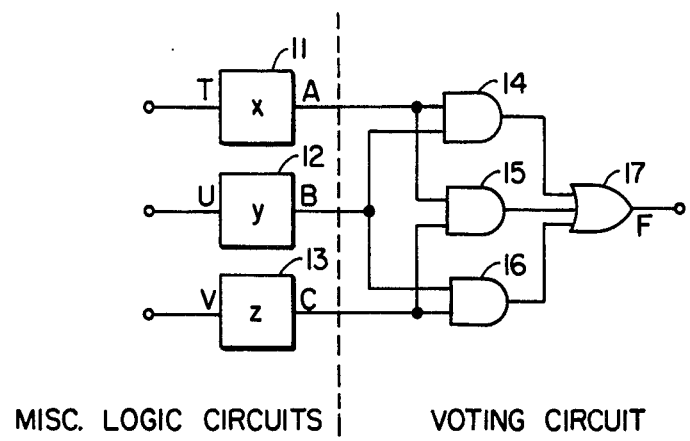
MISC. LOGIC CIRCUITS | VOTING CIRCUIT
*FIG._1.*   PRIOR ART
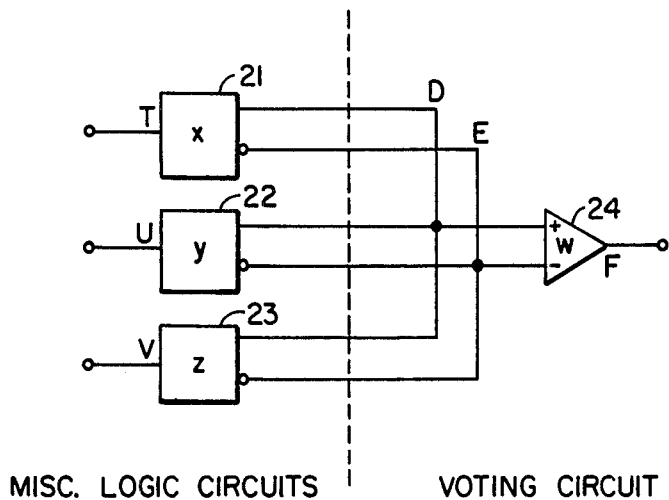
MISC. LOGIC CIRCUITS | VOTING CIRCUIT
*FIG._2.*

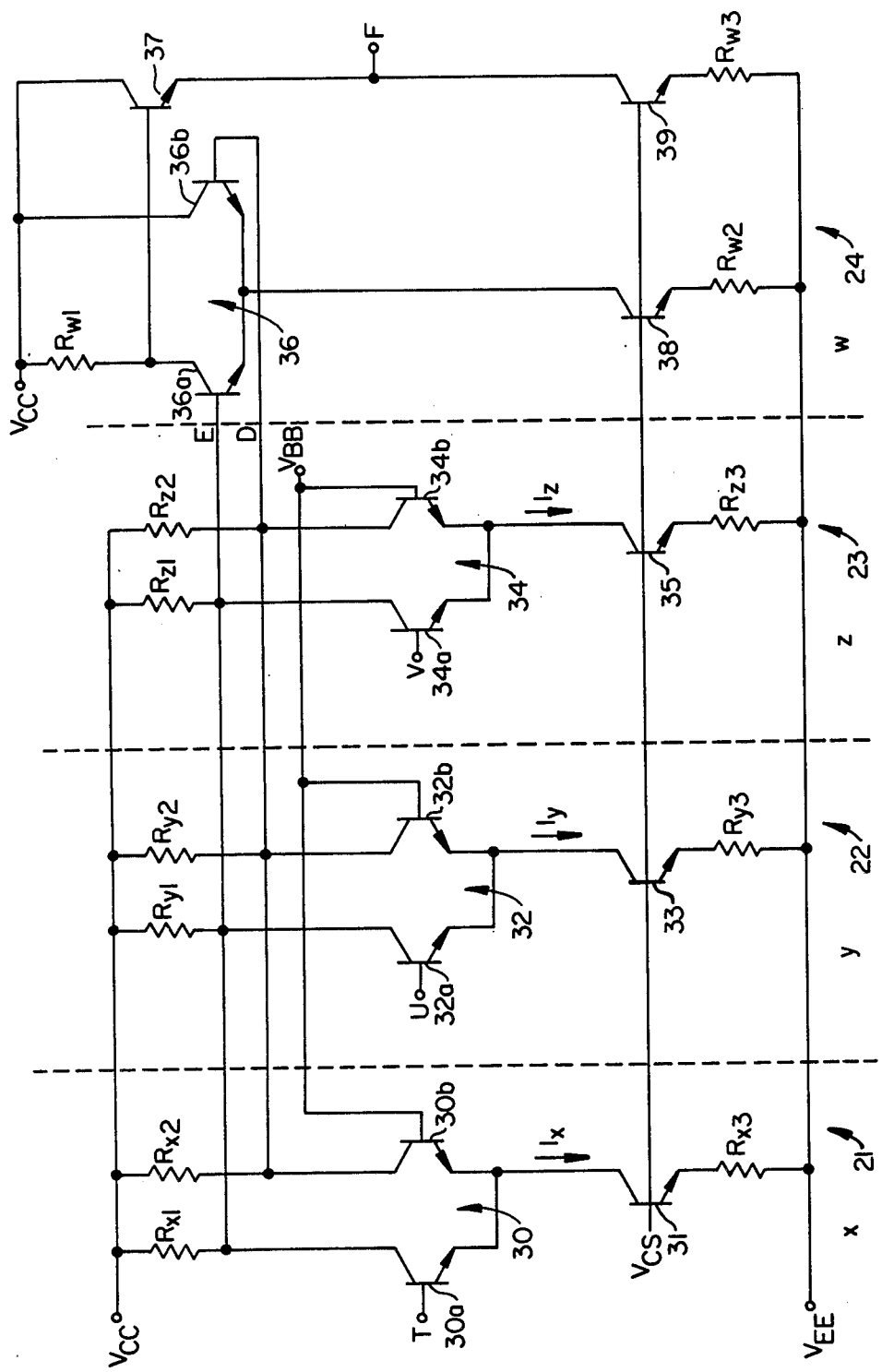
FIG._3.

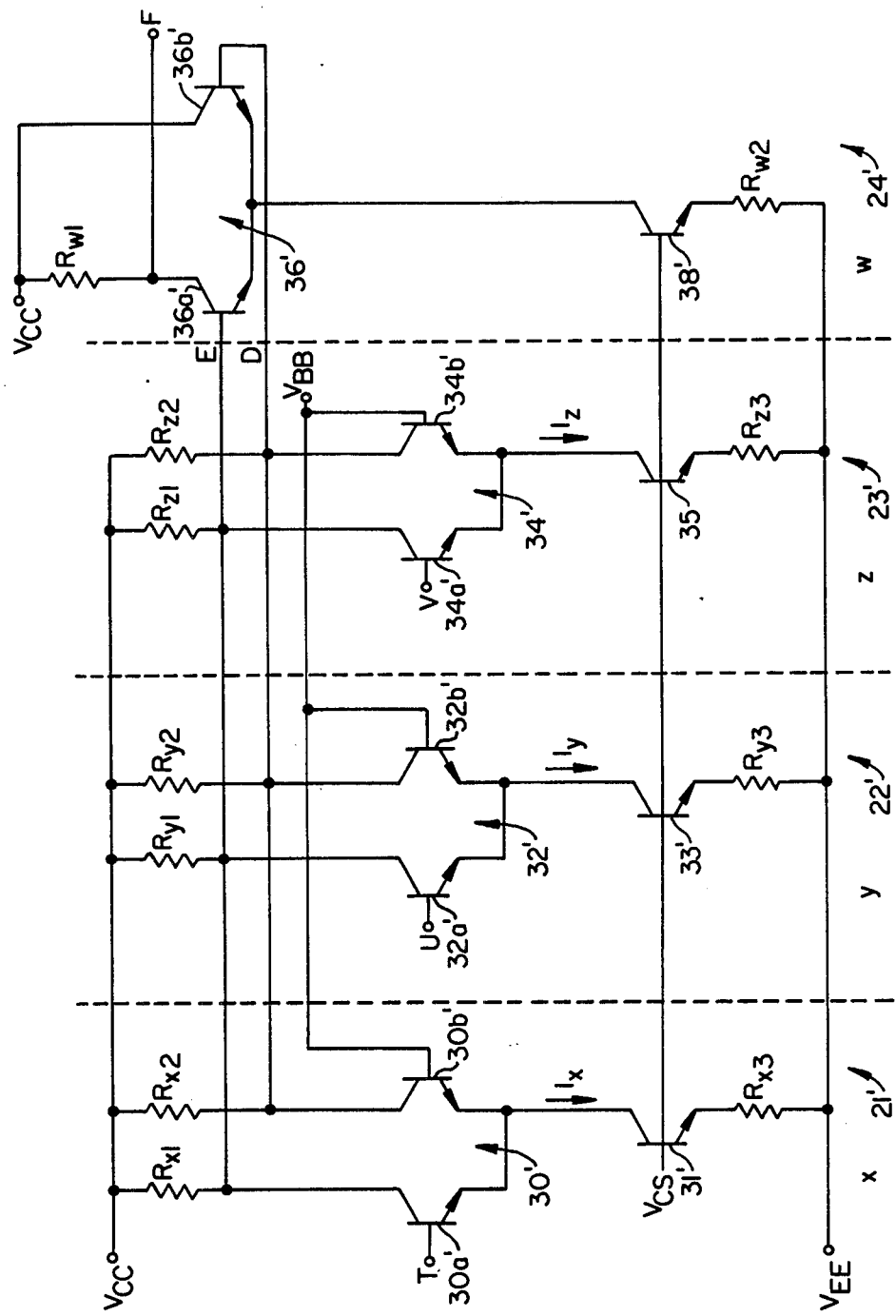
FIG._4.

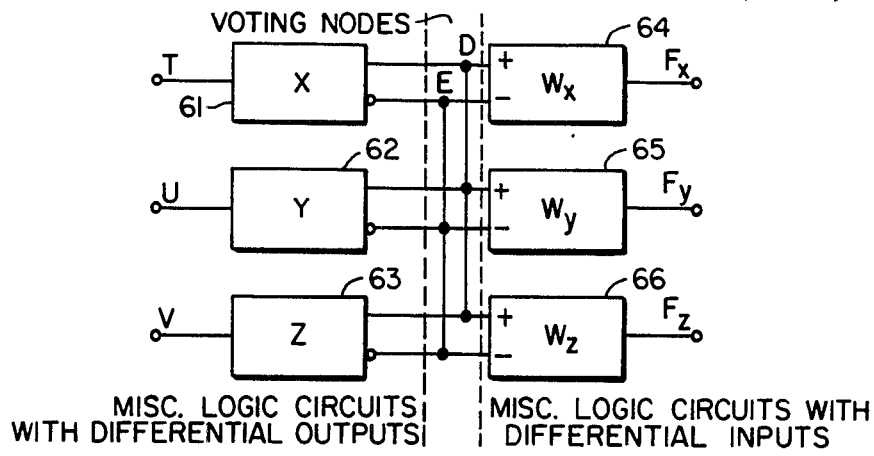
FIG._6.
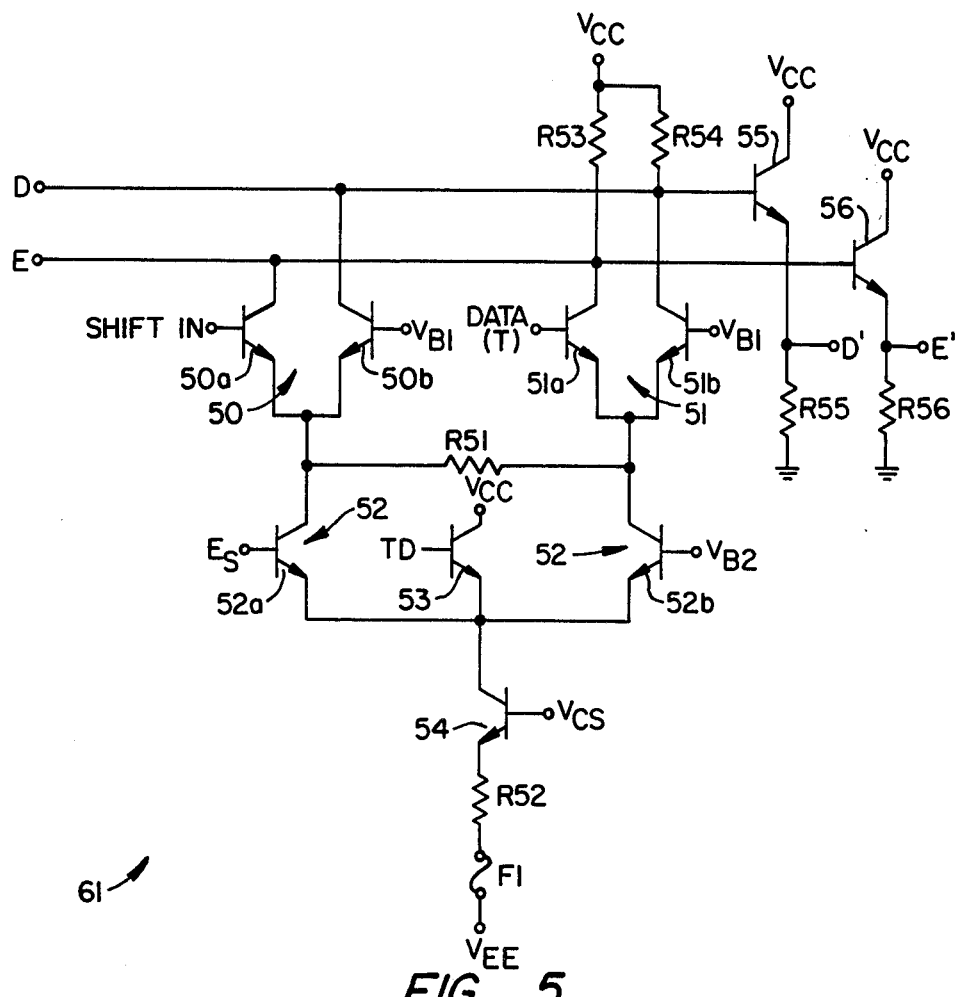
FIG._5.

4,617,475

WIRED LOGIC VOTING CIRCUIT

BACKGROUND OF THE INVENTION

1. Field of the Invention

The present invention relates to an electronic logic circuit. More particularly, the present invention relates to an improved logic voting circuit.

A voting circuit is a logic circuit of the type that provides an output which follows the majority of logic levels, such as two-out-of-three input logic levels. A logic equation for such a device is as follows:

$$F = AB + AC + BC$$

where F is the output of the function described and A, B, and C are the logical voting input signals.

The importance of logic voting circuits is well known. Such circuits accomplish important Boolean functions and therefore find ready application in the computer and electronic control arts. For example, voting circuits provide a means for implementing redundancy in high security devices where results along a single pathway are inadequate or insufficient. A high reliability logic function wherein polling of results, reducing the possibility of spurious responses or indications, thus obtains, thereby providing a failsafe redundant signal pathway. Additionally, integrated circuit yields are substantially improved by providing redundant circuit pathways wherein defective pathways are readily eliminated, thereby repairing an otherwise useless integrated circuit without impairing circuit performance.

2. Description of the Prior Art

One known technique for accomplishing voting uses AND and OR digital logic function circuits coupled in a voting circuit. A prior art voting circuit is shown in FIG. 1. Three miscellaneous logical circuits 11, 12, and 13 with functions designated X, Y, and Z, respectively, serve as inputs. These logical circuits each include corresponding control terminal inputs having values designated T, U, and V. Three corresponding logical output signals A, B, and C are generated on corresponding output lines.

The logical outputs A, B, and C are coupled to three AND gates 14, 15, and 16, the outputs of which are coupled to an OR gate 17 which produces a voted signal output F. The inputs to the AND gates are arranged such that an agreement between the levels of any two logical outputs (A, B, or C) produces a signal which, in turn, via OR gate 17, produces the voted output signal F.

Such known voting circuits require a plurality of digital AND gates, coupled to an OR gate, and have an overhead in function count (i.e. gates per function) that has heretofore not been easily reducible. Because two levels of logic are required for voting—the AND function and the OR function—there is also a signal propagation delay that affects circuit response time. The function count (number of gates) imposed by a two level voting circuit also imposes a power penalty for devices incorporating such voting circuits.

Known voting circuits also have relatively poor noise immunity. A spurious voting result is often produced by power supply voltage drops, power supply noise, and bias voltage noise. Additionally, a partial component failure (e.g., a partial transistor failure in a discrete circuit or monolithic device) can produce a continually wrong result by operating at other than narrowly defined critical digital logic levels. Thus, known voting circuits are level intolerant. In monolithic devices function yield is seriously degraded by such level intolerance where ambiguous results require that the device be discarded. Such devices, once fabricated, cannot be repaired.

Expanding such circuits to vote other odd numbers, such as three-out-of-five, exacerbates the function count overhead, requires additional circuit board space, imposes an additional power penalty, and makes the generation of incorrect results due to noise and other transient signal interference more likely.

Another shortcoming of known voting circuits is limited logic adaptability. If the circuit is operated at a predetermined logic standard, such as a high-equals-true circuit, it cannot readily be changed to a complement function. Such lack of versatility unnecessarily complicates the design task of the engineer. A voting circuit, which minimizes function count (number of gates) and power consumption while providing adequate noise immunity for its application, would be an advance in the art. A circuit additionally incorporating a complement option and voting expansion, while providing adequate noise immunity and repair capability, would be a significant advance in the art.

SUMMARY OF THE INVENTION

The present invention is a wired voting circuit. Such circuits find application where a plurality of logical inputs are to "vote" a majority condition. For example, given three logical conditions as inputs, two of which conditions are in agreement (e.g., true or false, high or low), then the agreeing inputs control a logic circuit output level.

In one embodiment of the invention, a wired voting logic circuit employs inverting collector nodes and non-inverting collector nodes of differential transistor pairs coupled as current-mode-logic (CML) or emitter-coupled-logic (ECL) gates and connected in a two-out-of-three voting configuration. To accomplish voting, the non-inverting collector nodes of first differential transistor pairs are coupled together at a first signal node, and the inverting collector nodes of first differential transistor pairs are coupled together at a second signal node. The first signal node is coupled to a first differential input of a second differential input transistor pair and the second signal node is coupled to a second differential input of the second differential input transistor pair, the output of which is the desired voted output signal.

Because there are no intermediate functional components, such as gates, the invention exhibits high immunity to power supply voltage drops, differing voltage levels, power supply noise, and bias voltage noise. Such high noise immunity provides a reliable voting technique that functions in a predictable manner, even in instances of degraded circuit operation. Thus, a high level of fault tolerance is provided which produces the surprising result of enhancing voting circuit reliability. Accordingly, a high security function is provided which assures failsafe operation in critical data pathways while allowing the use of components that would otherwise produce unpredictable results in level sensitive digital logic circuits.

Wired voting accomplished according to the present invention provides a low function (gates and other such components) count. Because the voting function is built into analog logic gates, comprised of differential transistor pairs, by wiring the transistor collectors together at non-inverting and inverting nodes, the only functional overhead (extra gates needed to accomplish voting) consists of a differential transistor pair for producing a voted output signal, and routing area (i.e. surface area in monolithic implementations of the invention) for the first and second signal nodes.

Since the only additional function required by the present invention is the second differential transistor pair which produces the voted output signal, the only additional power required to accomplish the voting function is that required to operate said differential transistor pair. In this way, the circuit operates at a low power level and does not unduly burden the circuit power source. In the present invention propagation delay which is a function of capacitive loading of the first and second output nodes and of the delay through the second differential transistor pair, is easily minimized without a large power penalty, resulting in improved circuit response time.

The wired voting arrangement may vote any odd number of gates, e.g., two-out-of-three, three-out-of-five, four-out-of-seven. A differential output may be provided by the present invention. Both true and complement outputs are available, such that additional voting applications of the present voting circuit are available. The voting function provided by the present invention is easily adapted to any other voting scheme without adding function count overhead or imposing a power penalty. Such versatility provides a circuit designer with options heretofore unavailable. For example, one embodiment of the invention provides for repair of monolithic devices by including a plurality of parallel pathways through the device. Upon diagnostic interrogation of the device's functional elements, defective pathways are located and eliminated. In this way, device yields are improved while device reliability is further enhanced.

BRIEF DESCRIPTION OF THE FIGURES

FIG. 1 is a block schematic diagram of a prior art voting circuit;

FIG. 2 is a block schematic diagram of the present invention;

FIG. 3 is a schematic diagram of an exemplary embodiment of the present invention which may find application in emitter coupled logic (ECL) circuits;

FIG. 4 is a schematic diagram of an exemplary embodiment of an invention which may find application in current mode logic (CML) circuits;

FIG. 5 is a schematic diagram of an alternate embodiment of a logic gate portion of the present invention incorporating a diagnosis and repair circuit; and FIG. 6 is a block schematic diagram of a highly redundant embodiment of the present invention.

DETAILED DESCRIPTION OF A PREFERRED AND ALTERNATE EMBODIMENTS

The present invention is a wired voting circuit. Such circuits find application where a plurality of logical inputs are to "vote" a majority condition. For example, given three logical conditions as inputs, two of which conditions are in agreement (e.g. true or false, high or low), then the agreeing inputs control a logic circuit output level.

In contrast to the prior art technique described above, the present wired logic voting circuit invention, as shown in FIG. 2, comprises a single amplification element W 24. Element 24 includes an analog, differential transistor pair. The principle of operation of the present invention differs radically from the prior art approach.

The embodiment of the present invention shown in FIG. 2 includes three logic elements 21, 22, and 23, labelled X, Y, and Z, respectively, and which include differential transistor pairs. Each logic element has a corresponding logic input T, U, and V and provides an inverting and a non-inverting analog output. The inverting output is shown as having a "bubble" at the output terminal of its associated element, 21, 22, or 23.

The inverting outputs of elements 21, 22, and 23 are all connected together to produce a signal node E, which is coupled to one input of element 24. The non-inverting outputs of elements 21, 22, and 23 are all connected together to produce a signal node D, which is connected to the other input of element 24. The embodiment of the invention shown in FIG. 2 provides three logic elements, 21, 22, and 23. The present invention may be produced in any number of voting arrangements, e.g. three-out-of-five, four-out-of-seven.

The signal levels at signal nodes D and E are never equal in the steady state case if an odd number of outputs are always produced by the odd number of logic elements. The polarity of the voltage difference between nodes D and E indicates the majority state of elements 21, 22, and 23. This voltage difference is amplified through element 24 to produce a voted output F. In this manner, voting is accomplished.

In operation, the state of nodes D and E is always different because the voltages at D and E are proportional to the number of analog currents applied to them, with node D receiving 0, 1, 2, or 3 analog currents and node E receiving 3, 2, 1, or 0 analog currents. Logic elements 21, 22, and 23 steer an analog current according to their selected state. For example, if element 21 has a low input signal, one analog current is steered to node D. If elements 22 and 23 each have a high input signal, then two analog currents are steered to node E. Because two analog currents are steered to the inverting input of element 24 and only one analog current is steered to the non-inverting input of element 24, a differential signal is sensed and amplified by element 24 to produce a high state as output signal F, which indicates that a high majority of signal inputs (U, V) are in agreement.

A schematic representation of a wired voting circuit is shown in FIG. 3. The circuit is referred to as being "wired" because the voting function and analog logic elements are unitary, that is, they are not implemented in several discrete functional elements. Each of logic elements X, Y, and Z (21, 22, and 23) is shown including a differential transistor pair by which a current is "steered" by one of the collectors of the pair to either signal node D or signal node E. Element W 24 is also shown as including a differential transistor pair by which the voltage differences between nodes D and E are sensed and amplified and by which a voted output signal is provided at terminal F.

A negative voltage source is provided along a voltage source bus $V_{EE}$; a circuit ground is provided along a ground bus $V_{CC}$. For purposes of circuit analysis, the following should be assumed:

$I_x = I_y = I_z = I_g;$ $R_{x1} = R_{x2} = R_{y1} = R_{y2} = R_{z1} = R_{z2} = R_g$ (where $R_g$ is a selected resistance value); and transistor current gain (beta) is infinite.

$R_{x1}$, $R_{y1}$, and $R_{z1}$ are in parallel. Therefore, the equivalent resistance between signal node E and $V_{CC}$ is $\frac{1}{3} R_g$. Similarly, $R_{x2}$, $R_{y2}$, and $R_{z2}$ are in parallel and the equivalent resistance between node D and $V_{CC}$ is $\frac{1}{3} R_g$.

The bases of transistors 31, 33, 35, 38, and 39 are connected to a constant voltage source $V_{CS}$. In the following discussion, transistor 31 is described, although such description also applies to transistors 33, 35, 38, and 39.

Transistor 31 and resistor $R_{x3}$ are configured in an arrangement commonly known as a constant current sink. In this configuration the base of transistor 31 is a fixed voltage bis $V_{CS}$, such that the voltage drop across resistor $R_{x3}$ is non-varying and the collector current of transistor 31 is constant (independent of signal input 'T'). This is a typical configuration for ECL and CML components.

The operation of logic element 21 may be described in the following manner: When a logic 'one' level is applied at input T (this implies that the voltage at T is significantly greater than the voltage at bias node $V_{BB}$), current $I_x$, which is generated by the current sink consisting of transistor 31 and resistor $R_{x3}$, is steered through transistor 30a to node E. When a logic "zero" level is applied at input T (this implies that the voltage at T is significantly lower than the voltage at bias node $V_{BB}$) current $I_x$ is steered through transistor 30b to node D.

Logic elements 22 and 23 operate in a substantially identical manner. Logic element 22 includes a differential transistor pair 32 wherein a logic level signal greater than bias voltage $V_{BB}$ is presented to input U at the base of transistor 32a, which steers constant current $I_y$ through a transistor 32a to node E. If a logic level signal less than bias voltage $V_{BB}$ is presented to input U, then transistor 32b steers constant current $I_y$ to node D.

Logic element 23 includes a differential transistor pair 34. When a logic level signal greater than bias voltage $V_{BB}$ is presented to input V at the base of transistor 34a, constant current $I_z$ is steered through transistor 34a to node E. If a logic level signal less than bias voltage $V_{BB}$ is presented to the base of transistor 34a, then transistor 34b steers constant current $I_z$ to node D.

Element 24 includes a differential transistor pair 36, wherein the base of transistor 36a is coupled to signal node E and wherein the base of transistor 36b is coupled to signal node D. The voltage difference between signal nodes D and E determines which one of transistors 36a or 36b is on. If the voltage at node E is significantly greater than node D, then transistor 36a is one and transistor 36b is off. If the voltage at node D is significantly greater than node E, then transistor 36b is on and transistor 36a is off. When transistor 36a is on, a voltage drop across resistor $R_{w1}$ is coupled to the base of a transistor 37 which translates said voltage down 1 $V_{BE}$ (base-emitter voltage) to produce the voltage at F.

Transistors 37 and 39 are connected in a configuration known as an emitter follower. The currents through transistors 39 and 37 are both constant. The output voltage F is 1 $V_{BE}$ below the base voltage of transistor 37. This circuit is typically used for emitter coupled logic (ECL) components and provides voltage translation and current gain without voltage gain. For current mode logic (CML) components the emitter follower stage is omitted and the output 'F' is taken at the collector of transistor 36a. Such arrangement is shown in FIG. 4. The functional elements noted with a (') in FIG. 4 operate in a manner substantially identical to the same elements shown in FIG. 3 and described herein.

Circuit operation, then, is as follows: Currents $I_x$, $I_y$, and $I_z$ are steered by logic elements 21, 22, and 23 to either signal nodes D or E, dependent upon the state of signals T, U, and V presented to the logic elements. The signals at signal nodes D and E are proportional to the number of currents steered to the signal node. Since there are an odd number of currents to be steered, the signal levels at nodes D and E are never equal during a steady state condition. The signal level difference between signal node D and signal node E indicates the logical majority input state of elements 21, 22, and 23, provided that signal T, U, and V are valid logic levels. Differential pair 24 compares the signal level difference between signal node D and signal node E and translates it to a voltage signal level compatible with other signals in the system at point F.

The possible states of the present invention are shown in the following truth table:

TRUTH TABLE

| INPUT STATE T U V | VOLTAGE AT NODE D | VOLTAGE AT NODE E | VOLTAGE DIFFERENCE D − E | OUTPUT STATE F |
|---|---|---|---|---|
| L L L | 0 | $-I_G R_G$ | $-I_G R_G$ | L |
| L L H | $-\frac{2}{3} I_G R_G$ | $-\frac{1}{3} I_G R_G$ | $-\frac{1}{3} I_G R_G$ | L |
| L H L | $-\frac{2}{3} I_G R_G$ | $-\frac{1}{3} I_G R_G$ | $-\frac{1}{3} I_G R_G$ | L |
| L H H | $-\frac{1}{3} I_G R_G$ | $-\frac{2}{3} I_G R_G$ | $\frac{1}{3} I_G R_G$ | H |
| H L L | $-\frac{2}{3} I_G R_G$ | $-\frac{1}{3} I_G R_G$ | $-\frac{1}{3} I_G R_G$ | L |
| H L H | $-\frac{1}{3} I_G R_G$ | $-\frac{2}{3} I_G R_G$ | $\frac{1}{3} I_G R_G$ | H |
| H H L | $-\frac{1}{3} I_G R_G$ | $-\frac{2}{3} I_G R_G$ | $\frac{1}{3} I_G R_G$ | H |
| H H H | $-I_G R_G$ | 0 | $I_G R_G$ | H |

H = HIGH,
L = LOW
ASSUME $V_{CC} = 0$

An alternative embodiment of the invention that includes a diagnostic circuit is shown schematically as circuit 61 in FIG. 5. The circuit shown in FIG. 5 corresponds to one logic element out of the plurality of logic elements that vote a plurality of logic input signals received along separate circuit pathways. A first differential transistor pair 51 includes a first transistor 51a for receiving a voting signal input (DATA) and a second transistor 51b for receiving a differential pair bias signal. The differential pair consisting of transistors 51a and 51b is coupled to voting nodes E and D, respectively.

The emitters of differential transistor pair 51 are coupled to a second stage differential pair 52 consisting of transistors 52a and 52b that are operable to provide a diagnostic mode and a normal mode of circuit operation controlled by the Es input.

The emitters of differential transistor pair 52 are coupled to a constant current sink transistor 54, which provides a current sink value as determined by a bias voltage supplied to the base of transistor 54 ($V_{CS}$). The emitter of transistor 54 is coupled to a circuit power supply $V_{EE}$ via a resistor R52 and a fuse F1, discussed below.

The circuit shown in FIG. 5 also provides a shift input differential transistor pair 50 consisting of a first transistor 50a, into which a diagnostic signal may be input and a second transistor 50b, having a differential operating level provided by bias signal VB1. A transistor 53 is coupled to the emitters of differential pair 52 to provide a forced disable of the logical element (61) during test disable mode. When the voltage at the base of transistor 53, node TD is significantly higher than Es or VB2, transistor 54 conducts all the collector current of transistor 54 which forces transistors 50a, 50b, 51a, 51b, 52a, 52b off. In this condition no current is provided to the voting nodes D and E via element 61 and element 61 is thereby disabled from participating in the vote. TD thereby controls the temporary disabling of element 61 from participating in voting.

During normal operation, data presented to transistor 51a produces a voting signal along lines D and E. Emitter follower transistors 55 and 56 translate the voltages at nodes D and E down 1 VBE and produce corresponding volting signals at nodes D' and E'.

When a diagnostic select signal is presented to terminal Es of transistor 52a, differential transistor pair 50 controls voting nodes D and E and, correspondingly, controls the outputs at terminals D' and E'. During the diagnostic process, a result may be forced from logic cell 61 as input into transistor 50a. The logic cell may be taken out of the voting process by providing a disable signal at terminal TD of transistor 53. Should the diagnostic procedure indicate that a particular cell is defective, that cell may permanently be disabled by blowing fuse F1, which electrically isolates the cell from the rest of the circuit. Fuse F1 may be blown in any number of known ways such as by a laser, a high voltage, or a software-operated latch.

FIG. 6 is a block schematic diagram of a highly redundant embodiment of the present invention including three logic cells X(61), Y(62), and Z(63), which receive respective voting inputs T, U, and V, and which produce a vote that is tabulated by corresponding differential logic cells $W_X(64)$, $W_Y(65)$, and $W_Z(66)$, which produce corresponding voted output signals $F_X$, $F_Y$, and $F_Z$. X, Y, and Z may be any miscellaneous logic circuits with differential outputs; $W_X$, $W_Y$, and $W_Z$ may be any miscellaneous logic circuits with differential inputs. Voting is provided by wiring the respective true and complement collector node outputs of circuit elements X, Y, and Z.

It can be seen in FIG. 6 that logic element 61 (shown schematically in FIG. 5) is a single input of the wired voting circuit. If logic element X (61) is defective, it may be left intact in the circuit because logic elements Y (62) and Z (63) should always vote in agreement if they are not defective. Such agreement among two out of three logic elements in a redundant pathway renders the vote of the defective cell insignificant. Alternatively, defective logic cells may be removed from the signal path as necessary, allowing the remaining logic cells to vote. In the case where a majority of logic cells are defective, they may be electrically removed from the circuit, allowing the remaining minority of logic cells to operate and produce the desired results.

As can be seen in FIG. 6, redundancy is not only provided at the logic input signal level, but also at the voting circuit level. Accordingly, a logic circuit having defective logic or voting cells may be "repaired" by eliminating defective cells, once the defective cells have been located by diagnostic testing. Such testing can include combinational logic probing of the various cells and voting patterns using known input signals to the voting cells and noting deviations from expected voting circuit logic outputs.

The herein described invention provides a circuit elegant in its simplicity, for accomplishing a voting function. The wired voting circuit builds a voting function into analog logic elements by wiring the collectors on each side of a differential transistor pair in a similar manner to the collectors of other logic elements. The only function overhead added by the present invention is the conductor used to connect the collector nodes together to form the voting nodes. Circuitry is reduced accordingly and propagation delay is minimized. Fewer functional elements require lower power to operate. Additionally, the differential feed from each signal node to the output element provides high circuit immunity to power line noise and prevents spurious results produced by level critical, fault intolerant digital logic circuits. Circuit redundancy provides high reliability signal processing while also providing improved yields of monolithic devices by allowing device fault diagnosis and circuit repair.

Exemplary and alternative embodiments of the invention have been described. Various other embodiments of the invention may be made without departing from the scope and spirit of the invention. For example, the wired voting device shown in the exemplary embodiment provides two-out-of-three voting. The circuit may be expanded to any odd numbered voting scheme, e.g., three-out-of-five, four-out-of-seven. Another embodiment of the invention contemplates a high (true) and a low (complement) signal level output. Additional embodiments of the invention contemplate using current mode logic (CML), emitter coupled logic (ECL), eliminating the output emitter follower transistors (37 and 39) in the case of current mode logic circuitry; and incorporating the function of differential transistor pair 36 into a feed circuit latch, multiplexer, exclusive OR, etc. In other embodiments of the invention, each of the input differential transistor pairs could be replaced with more complex logic functions. Therefore, the scope of the invention should be limited only by the claims.

I claim:

1. A wired logic voting circuit providing an output which follows the majority of input logic levels according to the formula:

$$F = AB + AC + BC$$

where F is the output of the function described and A, B, and C are the voting input signals, comprising:

a plurality of differential input logic elements, each of said elements comprising a differential transistor pair, the base of a first transistor of said transistor pair providing a voting input, the base of the second transistor of said transistor pair coupled to a reference level signal, the emitters of said transistor pair coupled together at a current sink, the collector of the first transistor of said transistor pair coupled through a resistor to a voltage source to provide a first logic level signal, the collector of the second transistor of said transistor pair coupled through a resistor to said voltage source to provide a second, opposite logic level signal, the collectors of the first transistors for all of said differential transistor pairs being wired together at a first signal node, the collectors of the second transistors for all of said differential transistor pairs being wired together at a second signal node;

an output differential transistor pair, including a first transistor having a base coupled to said first signal node and including a second transistor having a base coupled to said second signal node, the emitters of said output differential transistor pair being coupled together at a current sink, the collector of said first transistor of said output differential transistor pair being coupled through a resistor to a voltage source to provide an actuating output logic level signal, the collector of said second transistor of said output differential transistor pair being coupled to said voltage source, wherein a signal level at one signal node is never equal to a signal level at the other-signal node and wherein the polarity of signal level difference between the two signal nodes indicates the majority state of the input logic signals; and a diagnositic circuit, coupled between the emitters of said logic element transistor pair and said current sink, for locating and isolating defective logic element transistor pairs.

2. The voting circuit of claim 1, further comprising:

a plurality of differential diagnostic elements coupled in parallel with said differential input logic elements and being operable to receive a diagnostic data signal;

means for selecting between operation of said differential input logic elements and said differential diagnostic elements in response to a diagnostic select signal;

means for selectively disabling the operation of at least one of said differential input logic elements in response to a logic element disable signal provided during a diagnostic sequence initiated by said diagnostic data signal; and means, responsive to a programming signal, for isolating defective differential input logic elements from said wired logic voting circuit.

3. The voting circuit of claim 2, said means for isolating comprising a cutable link.

4. A redundant wired logic voting circuit providing an output which follows the majority of input logic levels according to the formula:

$$F=AB+AC+BC$$

where F is the output of the function described and A, B, and C are the voting input signals, comprising:

a first plurality of differential input logic elements, each of said elements comprising a differential transistor pair, the base of a first transistor of said transistor pair providing a first voting input, the base of the second transistor of said transistor pair coupled to a reference level signal, the emitters of said transistor pair coupled together at a current sink, the collector of the first transistor of said transistor pair coupled through a resistor to a voltage source to provide a first logic level signal, the collector of the second transistor of said transistor pair coupled through a resistor to said voltage source to provide a second, opposite logic level signal, the collectors of the first transistors for all of said differential transistor pairs being wired together at a first signal node, the collectors of the second transistors for all of said differential transistor pairs being wired together at a second signal node;

a second plurality of differential input logic elements, each of said elements comprising a differential transistor pair, the base of a first transistor of said transistor pair coupled to said first node, the base of the second transistor of said transistor pair coupled to said second node, the emitters of said transistor pair coupled together at a current sink, the collector of the first transistor of said transistor pair coupled through a resistor to a voltage source to provide a first output logic level signal, the collector of the second transistor of said transistor pair coupled through a resistor to said voltage source to provide a second, opposite output logic level signal, the collectors of the first transistors for all of said differential transistor pairs being wired together at a first output signal node, the collectors of the second transistors for all of said differential transistor pairs being wired together at a second output signal node; and an output differential transistor pair, including a first transistor having a base coupled to said first output signal node and including a second transistor having a base coupled to said second output signal node, the emitters of said output differential transistor pair being coupled together at a current sink, the collector of said first transistor of said output differential transistor pair being coupled through a resistor to a voltage source to provide an actuating output logic level signal, the collector of said second transistor of said output differential transistor pair being coupled to said voltage source, wherein a signal level at one output signal node is never equal to a signal level at the other output signal node and wherein the polarity of signal level difference between the two output signal nodes indicates the majority state of the input logic signals.

* * * * *